US012770684B2

(12) United States Patent
Cho

(10) Patent No.: US 12,770,684 B2
(45) Date of Patent: Oct. 20, 2026

(54) CONFIGURATION BIT CIRCUIT FOR PROGRAMMABLE LOGIC DEVICE INCLUDING PHASE CHANGE MEMORY AND OPERATION METHOD THEREOF

(71) Applicant: Revol-Ver Inc., Yongin-si (KR)

(72) Inventor: Sung Lae Cho, Gwacheon-si (KR)

(73) Assignee: Revol-Ver Inc., Yongin-si (KR)

( * ) Notice: Subject to any disclaimer, the term of this patent is extended or adjusted under 35 U.S.C. 154(b) by 140 days.

(21) Appl. No.: 18/651,865

(22) Filed: May 1, 2024

(65) Prior Publication Data

US 2024/0371440 A1 Nov. 7, 2024

(30) Foreign Application Priority Data

May 3, 2023 (KR) ........................ 10-2023-0057715

(51) Int. Cl.
*G11C 13/00* (2006.01)
*H03K 19/1776* (2020.01)

(52) U.S. Cl.
CPC ...... *G11C 13/0069* (2013.01); *G11C 13/0004* (2013.01); *H03K 19/1776* (2013.01); *G11C 2213/30* (2013.01)

(58) Field of Classification Search
CPC .................................................... G11C 11/161
See application file for complete search history.

(56) References Cited

U.S. PATENT DOCUMENTS

| | | | | |
|---|---|---|---|---|
| 5,898,619 A * | 4/1999 | Chang | G11C 11/404 | 257/E21.654 |
| 2007/0171706 A1* | 7/2007 | Fuji | G11C 13/0069 | 365/163 |
| 2014/0319634 A1* | 10/2014 | Shukh | G11C 11/161 | 257/427 |
| 2021/0083184 A1* | 3/2021 | Kobayashi | H10B 63/24 | |

FOREIGN PATENT DOCUMENTS

| | | |
|---|---|---|
| JP | 2012-515449 A | 7/2012 |
| KR | 10-2008-0097310 A | 11/2008 |
| KR | 10-2009-0065030 A | 6/2009 |
| KR | 10-2010-0008883 A | 1/2010 |

* cited by examiner

*Primary Examiner* — Jason Lappas
(74) *Attorney, Agent, or Firm* — Bridgeway IP Law Group, PLLC; Jihun Kim

(57) ABSTRACT

To provide a configuration bit circuit utilizing a phase change memory and an operation method thereof, the configuration bit circuit for a programmable logic device including a phase change memory may include a first phase change memory element and a second phase change memory element connected in series with each other between a first power source and a second power source, and a transmission gate connected to the first phase change memory element and second phase change memory element in a first direction.

6 Claims, 11 Drawing Sheets

CONFIGURATION BIT CIRCUIT FOR PROGRAMMABLE LOGIC DEVICE INCLUDING PHASE CHANGE MEMORY AND OPERATION METHOD THEREOF

CROSS-REFERENCE TO RELATED APPLICATIONS

This application claims the priority of Korean Patent Application No. 10-2023-0057715 filed on May 3, 2023, in the Korean Intellectual Property Office, the disclosure of which is incorporated herein by reference.

BACKGROUND OF THE INVENTION

1. Field of the Invention

The present invention relates to a configuration bit circuit for a programmable logic device including a phase change memory, and more particularly, to a configuration bit circuit that is programmable so that the phase change memory can have a high threshold voltage, and a programming method thereof.

2. Description of the Related Art

A field programmable gate array (FPGA) is a device whose function is not fixed during manufacture but has a specific function through programming by a user, and is a type of programmable logic device (PLD). Due to the variable characteristics the FPGA, the FPGA has recently been linked with the 4th industrial revolution and its uses are expanding very widely to communication equipment, automobiles, industrial use, and artificial intelligence.

As illustrated in FIG. 1, such an FPGA generally includes a logic block (LB), a connection block (CB) and a switch block (SB), each of which includes a configuration bit that may be programmed by the user to allow the entire FPGA to have a circuit according to a user's intention.

FIG. 1 illustrates that configuration bits M1 and M2 are used in various parts (the logic block, the switch box, the connection block, etc.) on the FPGA circuit. For example, the configuration bit M1 is a memory element that configures a routing resource and is placed inside, outside, and on the periphery of the logic block, and the configuration bit M2 becomes a memory element that allows a lookup table to be configured in various ways.

In a conventional FPGA, 6-T SRAM was mainly used for the configuration bit circuit, and accordingly, an excessive area is required, and due to the nature of SRAM as a volatile memory, a separate memory device should be placed outside the FPGA and stored information should be loaded each time the SRAM is driven. Therefore, it takes time to drive and a lot of energy is inevitably consumed, and in particular, there is a high possibility that a security problem will occur. In addition, there is a possibility of damage due to radiation when used in airplanes, etc.

In order to overcome these shortcomings of SRAM, there is an attempt to construct the configuration bit using a phase change memory, and a technology for constructing the configuration bit circuit through a 1T-2P structure connecting two phase change memories (2P) and one transistor (1T) was proposed at P. E. Gaillardon et al., "Phase-Change-Memory-Based Storage Elements for Configurable Logic", 2010 International Conference on Field-Programmable Technology.

The structure, operation, and programming method of the configuration bit circuit having such a 1T-2P structure are illustrated in FIGS. 2 and 3. FIG. 2 is a diagram illustrating the structure and programming method of a configuration bits 100 composed of 1T-2P.

FIG. 2(*a*) illustrates creating a low resistance state SET by flowing a current into a phase change memory 110, and FIG. 2(*b*) illustrates creating the low resistance state SET by flowing a current into a phase change memory 120. In this case, since the phase change memories 110 and 120 have a complementary relationship, when one is in the low resistance state SET, the other is in a high resistance state RST. When programming the phase change memory, the current flows from a power source VPGM1 or a power source VPGM2 through a transistor 130 to a power source VSS. When programming one phase change memory, the other phase change memory is made to be a floating state to prevent current from flowing.

Meanwhile, FIG. 3 is a diagram illustrating an operation mode of the configuration bit 100 composed of 1T-2P.

In FIG. 3(*a*), the phase change memory 110 is in a low resistance state SET, and thus a voltage applied from a power source VOP1 is applied to a gate electrode of a transistor 210 of an FPGA logic 200 circuit through the phase change memory 110. The phase change memory 120 is in the high resistance state RST, and thus the current passing through the phase change memory 110 from the power source VOP1 does not flow or flows very weakly. Due to this voltage divider effect, the voltage from the power source VOP1 passes through the phase change memory 120 and becomes an output voltage (VOUT=1.2 V). Therefore, the configuration bit 100 of FIG. 3(*a*) outputs a voltage of 1.2 V.

In contrast, FIG. 3(*b*) illustrates a case where the phase change memory 110 is in the high resistance state RST. In this case, the voltage applied from the power source VOP1 does not pass through the phase change memory 110, and 0 V of a ground power source 112 is applied to the gate electrode of the transistor 210 of the FPGA logic 200 circuit.

However, as an operating voltage of a general logic circuit applied to the configuration bits 100, a voltage higher than a threshold voltage of the phase change memory may be used. FIGS. 3(*a*) and (*b*) illustrate an example in which 1.2 V is applied, and this applied voltage may be higher than the threshold voltage of a general phase change memory. If a voltage greater than the threshold voltage is applied to the phase change memory, there is a concern that not only the phase change memory that is intended to be in the low resistance state but also the phase change memory in the high resistance state will be turned on and changed to the low resistance state.

FIG. 4 illustrates an I-V curve of the phase change memory. In the memory in the high resistance state RST, the I-V curve has a threshold voltage Vth, and thus when a voltage greater than the threshold voltage is applied, it turns on and a large current flows instantaneously, and accordingly, the memory in the high resistance state may be phase-changed to the low resistance state. As illustrated in FIG. 4, when a voltage V1 lower than the threshold voltage Vth is applied, only a small current I1 flows and there is no possibility of a phase change occurring, but when a voltage V2 higher than the threshold voltage Vth is applied, a large current I2 flows and accordingly, the possibility of the phase change occurring increases.

However, an operating voltage level of a logic circuit, which is commonly used, is higher than a threshold voltage of a normal phase change memory when considering the threshold voltage, and thus there is a high possibility of turning it on. In this case, in an operation mode of the 1T-2P configuration bit 100 in FIG. 3(*a*), the second phase change memory 120, which is in the high resistance state RST, may be phase-changed to the low resistance state SET by the applied voltage VOP1. In this case, both memories may be in the low resistance state SET, which may cause a problem in which the signal of the originally programmed configuration bit 100 cannot be accurately transmitted to the FPGA logic 200. Also, in FIG. 3(*b*), when the voltage from the power source VOP1 is equal to or greater than the threshold voltage of the phase change memory 110, the phase change memory may be phase-changed from the high resistance state to the low resistance state, and accordingly, stored information may change and an incorrect signal may be transmitted to the FPGA logic 200.

Thus, the configuration bit circuit having the 1T-2P structure has a problem that programmed information may be changed during operation due to the characteristics of the phase change memory.

SUMMARY OF THE INVENTION

The present invention provides a configuration bit circuit utilizing a phase change memory and an operation method thereof.

According to an embodiment of the invention, there is provided a configuration bit circuit for a programmable logic device including a phase change memory, the configuration bit circuit including a first phase change memory and a second phase change memory connected in series with each other between a first power source and a second power source, and a transmission gate connected to the first and second phase change memory elements in a first direction.

In the configuration bit circuit for the programmable logic device including the phase change memory according to the embodiment of the invention, a composition of a phase change layer in the first phase change memory element and the second phase change memory element may include Ge, Sb, and Te.

In the configuration bit circuit for the programmable logic device including the phase change memory according to the embodiment of the present invention, the composition of the phase change layer may be Ge<50 at %, Sb<40 at %, and Te≥50 at % at an atomic ratio.

According to another embodiment of the invention, there is provided a method of programming a configuration bit circuit for a programmable logic element including a phase change memory, the method including, when a voltage applied to the transmission gate from one of the first power source and the second power source through one of the first phase change memory and the second phase change memory is referred to as a first polarity voltage and a voltage applied from the transmission gate through one of the first phase change memory and the second phase change memory to one of the first power source and the second power source is referred to as a second polarity voltage, programming one of the first phase change memory and the second phase change memory to be in a first resistance state by the first polarity voltage and programming one of the first phase change memory and the second phase change memory to be in a second resistance state by the second polarity voltage, in which one of the first phase change memory and the second phase change memory is in the first resistance state and the other is in the second resistance state, one of the first resistance state and the second resistance state refers to a low resistance state because the phase change memory is in a crystalline phase, and the other refers to a high resistance state because the phase change memory is in an amorphous phase.

According to still another embodiment of the invention, there is provided a method of operating a configuration bit circuit for a programmable logic device including a phase change memory, in which a voltage applied to the first power source or the second power source for an operation of the configuration bit circuit is lower than a threshold voltage when the first phase change memory or the second phase change memory is in a high resistance state.

According to still yet another embodiment of the invention, there is provided a programmable logic device including a configuration bit circuit that includes a phase change memory according to the invention.

An FPGA device to which the configuration bit circuit utilizing the phase change memory is applied according to the invention have reduced manufacturing costs, have a small area, have excellent security, and are resistant to radiation.

DETAILED DESCRIPTION OF THE EXEMPLARY EMBODIMENTS

Figure 1:
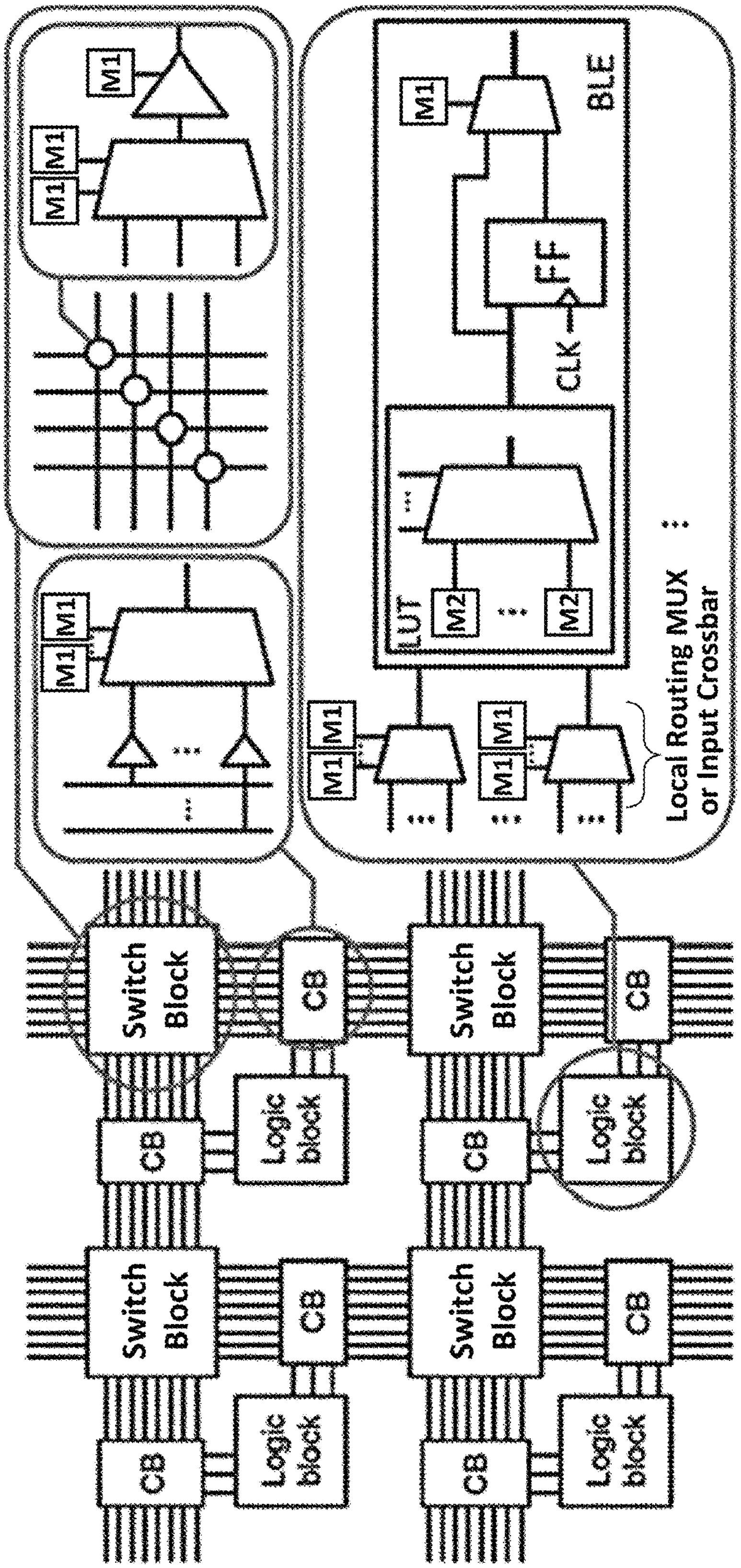
FIG. 1 is a diagram illustrating the application of a configuration bit in an FPGA device.
Figure 2:
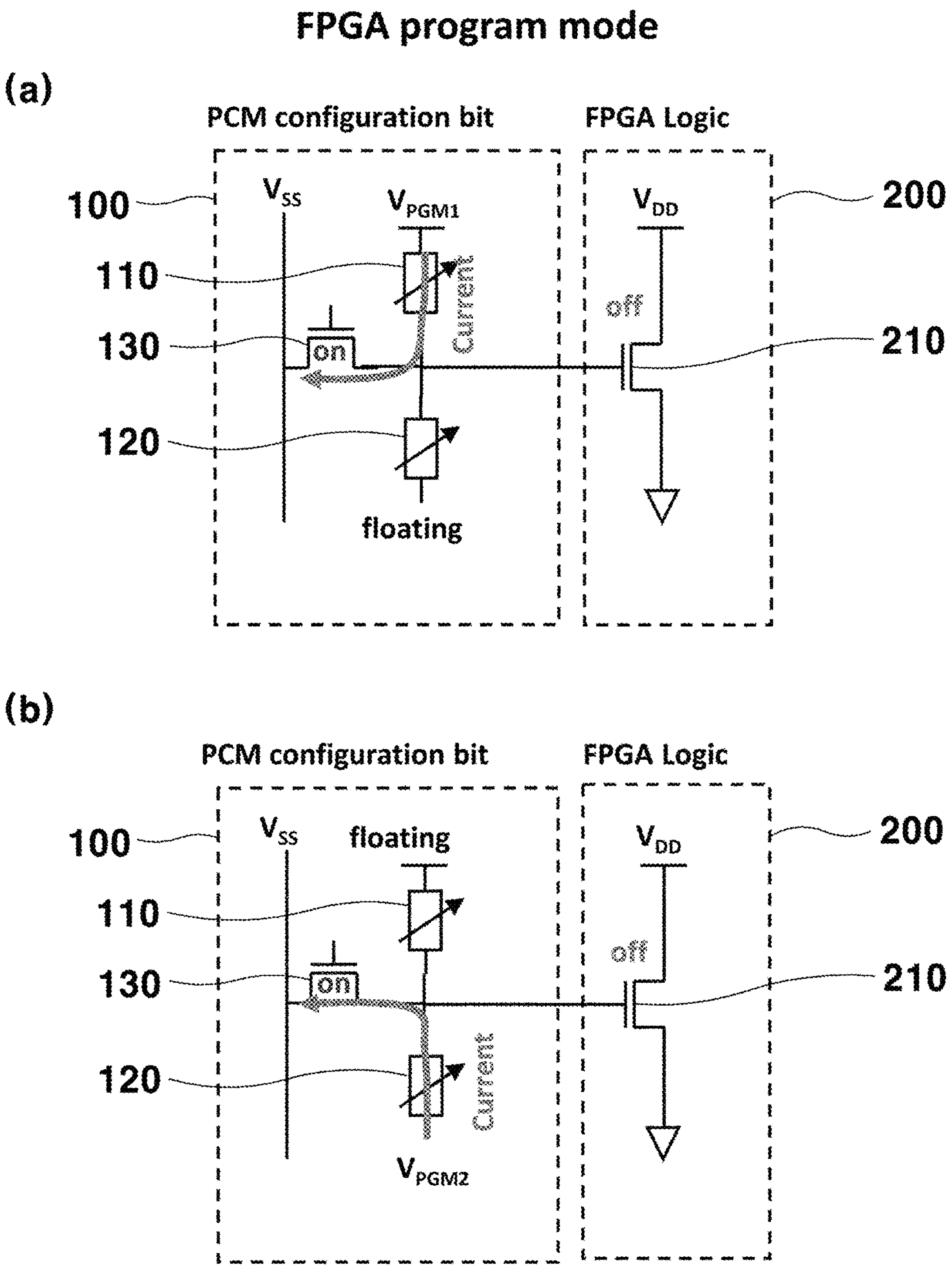
FIG. 2 is a diagram illustrating a program mode in a configuration bit circuit including a conventional phase change memory.
Figure 3:
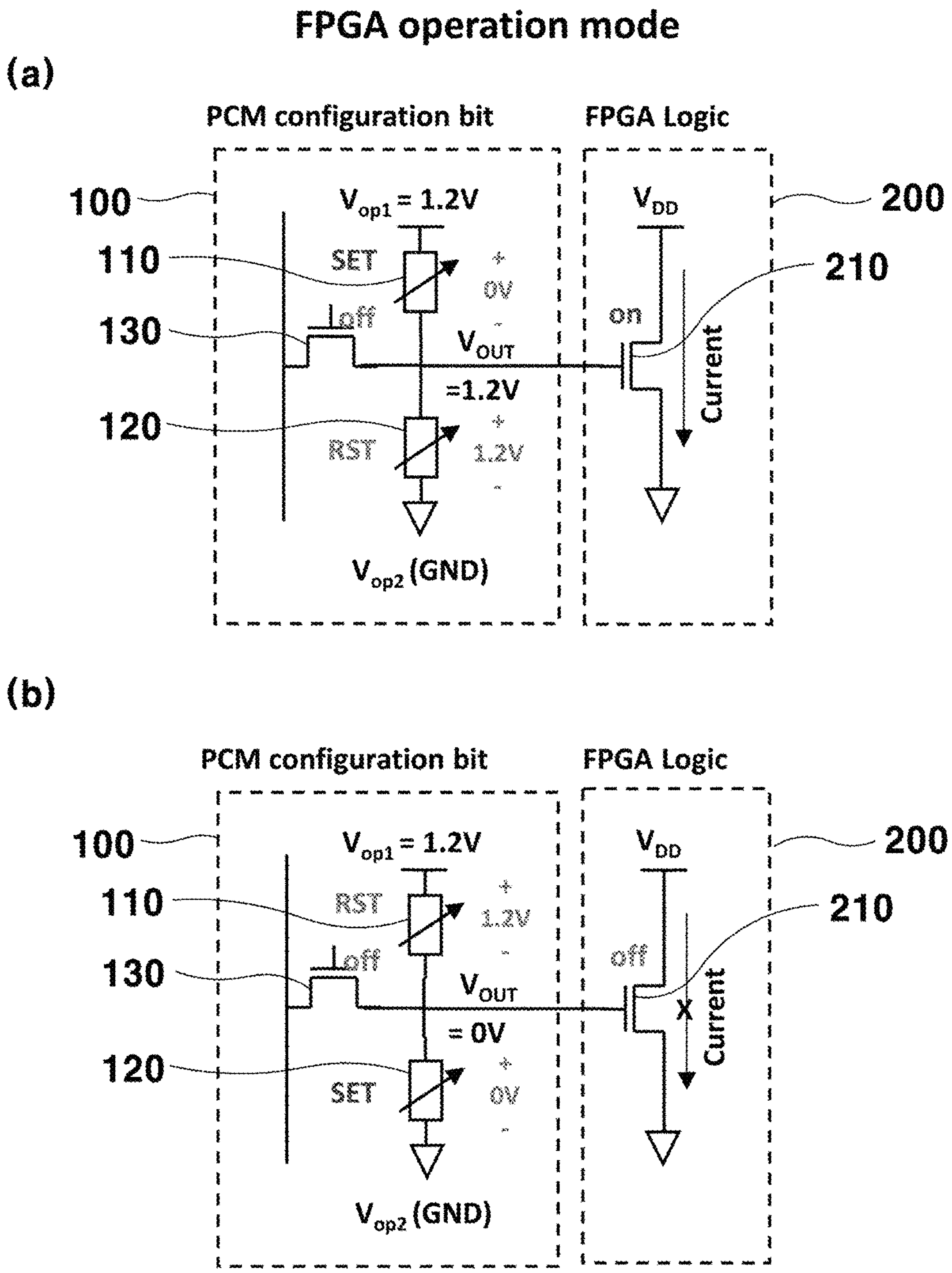
FIG. 3 is a diagram illustrating an operation mode in the configuration bit circuit including the conventional phase change memory.
Figure 4:
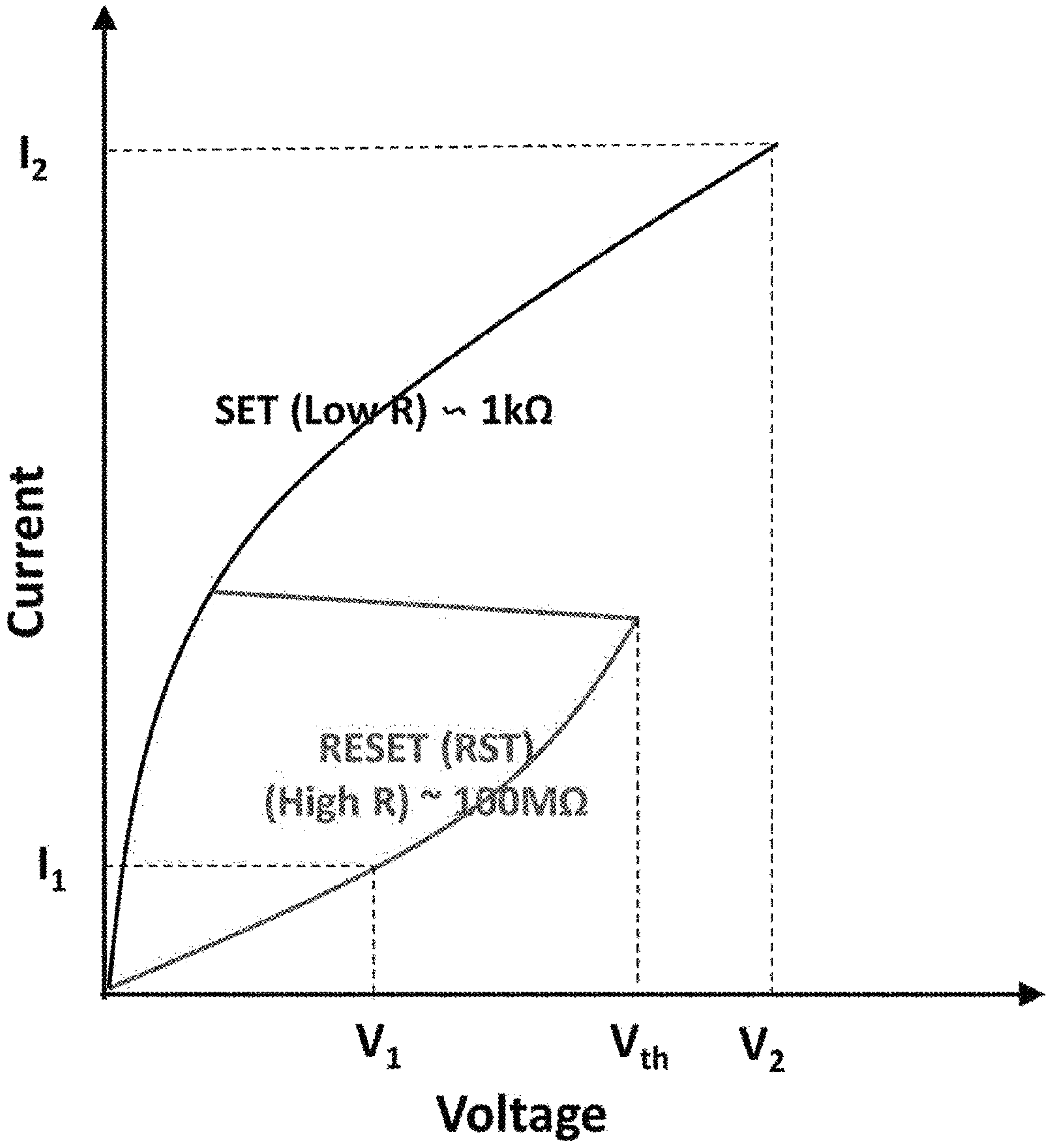
FIG. 4 is a graph illustrating a general I-V curve of a phase change memory.

Hereinafter, embodiments of the present invention will be described in detail with reference to the accompanying drawings so that those of ordinary skill in the art to which the present application belongs can easily implement them. However, the present application may be implemented in various different forms and is not limited to the embodiments described herein.

In addition, in order to clearly describe the present application in the drawings, parts unrelated to the description have been omitted, and similar reference numerals have been assigned to similar parts throughout the specification.

Throughout the specification of the present application, when a part is said to be "connected" to another part, this includes not only cases where it is "directly connected," but also cases where it is "electrically connected" with another element in between.

Throughout the specification of the present application, when a member is said to be located "on", "on an upper part", "at the top", "below", "at a lower part", or "at the bottom" of another member, this includes not only cases where the member is in contact with another member, but also cases where another member exists between two members.

Throughout the specification of the present application, when a part is said to "include" a certain constituent element, this means that it can further include other constituent elements rather than excluding other constituent elements, unless specifically stated to the contrary.

As used in this specification, the terms "approximately", "substantially", etc. are used to mean at or close to that numerical value when manufacturing and material tolerances unique to the meaning mentioned are given, and are used to prevent unscrupulous infringers from unfairly using the disclosed contents in which accurate or absolute numerical values are mentioned in order to aid the understanding of the present invention. In addition, throughout the specification of the present application, "a step of doing ~" or "a step of ~" does not mean "a step for ~".

Throughout the specification of the present application, the term "combination thereof" means a mixture or combination of one or more selected from a group consisting of the constituent elements described in the expression of the Makushi format, and means including one or more selected from the group consisting of the constituent elements.

Throughout the specification of the present application, the description of "A and/or B" means "A or B, or A and B".

In the programmable logic device, the configuration bit circuit is programmed to a desired logic state and then operated according to the programmed state to control a circuitry within the device. Unlike a conventional SRAM-based configuration bit circuit, a logic state of the configuration bit circuit including the phase change memory according to the present invention is programmed according to a resistance state of the phase change memory, and the configuration bit circuit operates according to the programmed logic state.

However, in order for the phase change memory to be used in the configuration bit circuit, it is important that the resistance state does not change during operation of the configuration bit circuit so that the programmed logic state does not change as described above. To this end, it is preferable that a threshold voltage of the phase change memory is higher than a voltage applied to the phase change memory during operation. To this end, the present invention provides a configuration bit circuit including a phase change memory that allows the phase change memory to have a high threshold voltage in the configuration bit circuit and a method of programming such a configuration bit circuit.

In the configuration bit circuit to which the conventional phase change memory is applied, due to a low threshold voltage of the phase change memory, as the phase change memory is turned on by an operating voltage of the circuit, an unwanted change may occur in the programmed state. To prevent this, the threshold voltage of the phase change memory needs to be increased.

Meanwhile, in order to increase the threshold voltage of the phase change memory, a method of adjusting a composition or thickness of materials forming the phase change memory is known. However, a method of changing resistance in an amorphous state depending on a polarity of an applied voltage even with the same composition and thickness has also recently become known. Even in the high resistance amorphous state, a composition distribution in the amorphous state varies depending on the applied voltage and accordingly, the resistance state of the phase change memory may be changed. If the resistance state changes, the threshold voltage in the high resistance state may change accordingly.

In general, the phase change memory is characterized by changing electrical conductivity through a phase change between a low resistance crystalline state and a high resistance amorphous state. However, even in the amorphous state, differences in electrical conductivity can be achieved.

Figure 5:
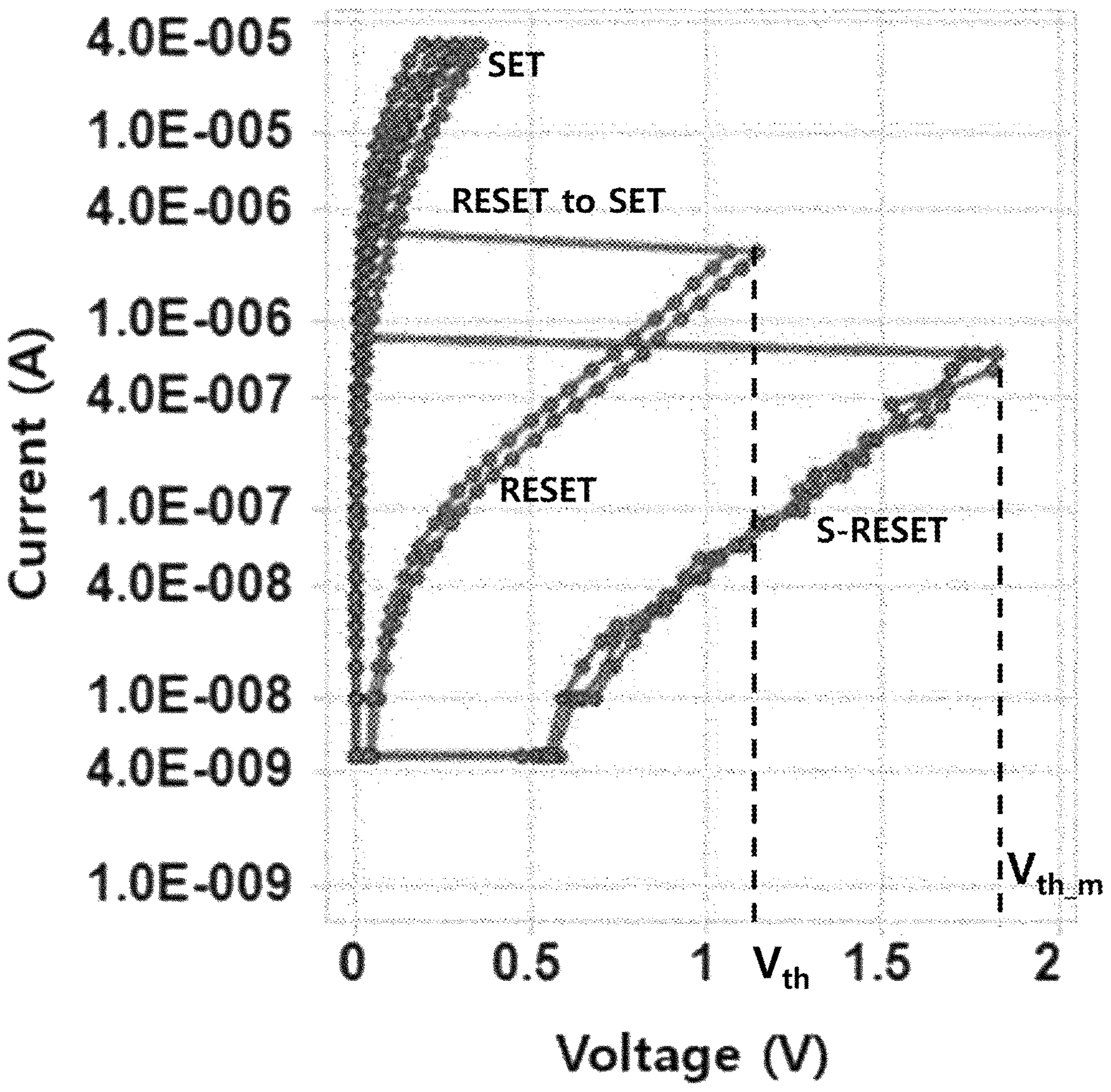
FIG. 5 is a graph illustrating the I-V curve of the phase change memory when a voltage is applied with different polarity.
Figure 6:
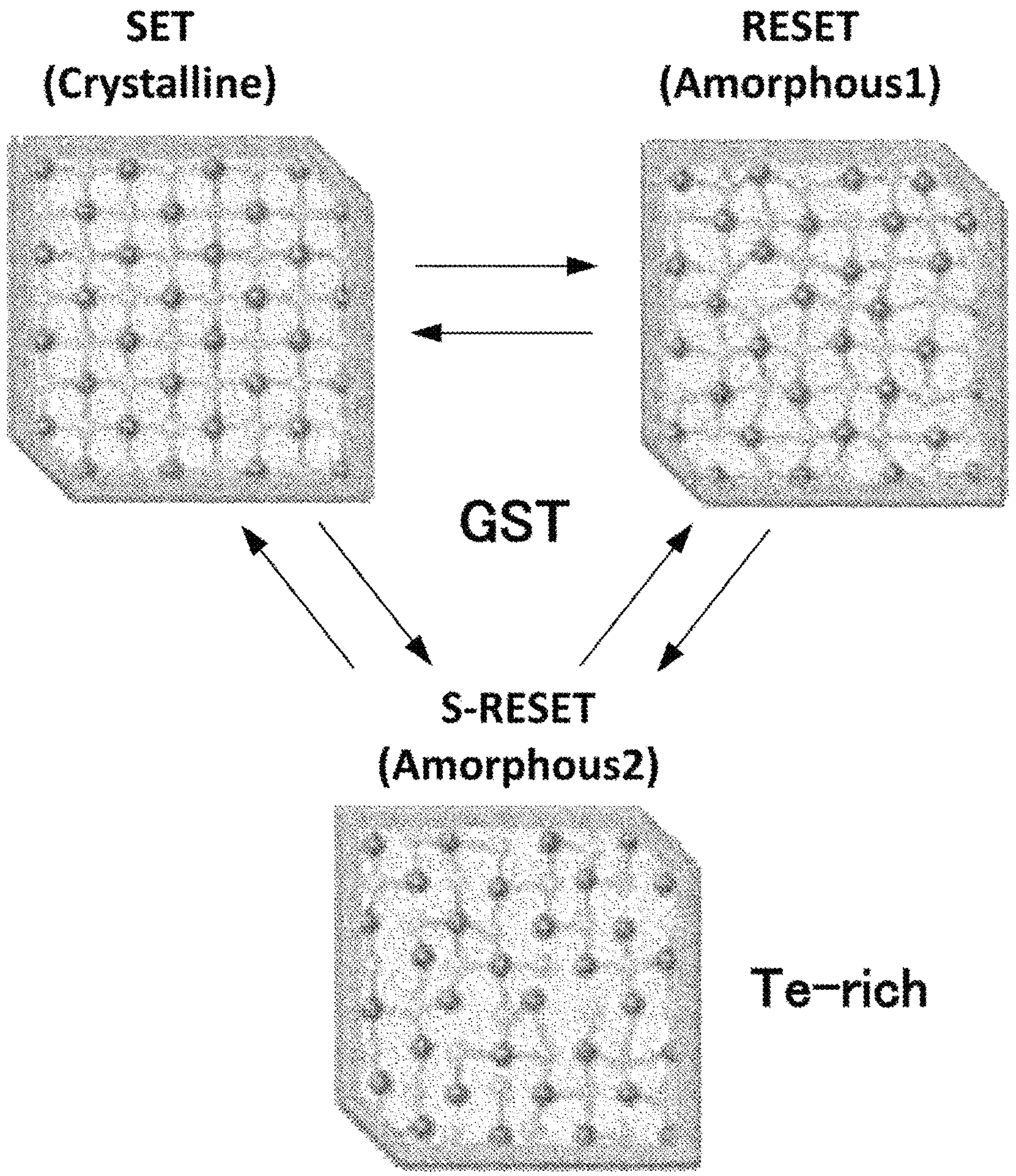
FIG. 6 is a diagram illustrating a phase change of the phase change memory when a voltage is applied with different polarity.

These characteristics will be described through FIGS. 5 and 6. FIG. 5 is a graph illustrating the I-V curve of the phase change memory. In FIG. 5, the phase change memory in a first high resistance state RESET, which is generally a high resistance state, is turned on at a voltage equal to or higher than a first threshold voltage Vth and is converted to a low resistance state (RESET to SET), which is a crystallized state. In FIG. 5, the first threshold voltage Vth is at a level of 1.2 V, which is very close to 1.2 V, which is a typical circuit operating voltage. In this state, there is a high probability that the phase change memory in the first high resistance state RESET will be unwillingly converted to the low resistance crystallization state SET during operation.

Meanwhile, when an opposite polarity voltage of a certain magnitude or more is applied to the phase change memory in the low resistance state, it is converted into a second high resistance state S-RESET, which is a higher resistance state than the first high resistance state RESET, which is a normal high resistance state.

In order to convert the phase change memory converted to the second high resistance state S-RESET back to the low resistance state, a voltage equal to or higher than a second threshold voltage Vth_m should be applied.

The reason that the high resistance level can be divided even in the high resistance state is because, even in the high resistance amorphous state, differences in resistance may appear depending on the composition distribution within the amorphous state. This is illustrated in FIG. 6, which illustrates a crystalline low resistance state, the first high resistance state RESET (Amorphous1), which is a general high resistance state, and the second high resistance state S-RESET (Amorphous2) in which agglomeration occurs in the distribution of some compositions.

In one embodiment of the present invention, GST (Ge—Sb—Te) ternary composition can be used as a phase change layer composition of the phase change memory, and when a voltage of opposite polarity of a certain level or more is applied, the distribution of Te is increased around a heater electrode attached to a phase change layer, and thus the higher resistance state S-RESET may be achieved.

In this way, when programming the phase change memory by applying a voltage in the opposite direction to that in actual operation, the phase change memory can be converted to the second high resistance state S-RESET having a higher resistance than the first high resistance state RESET, and accordingly, the effect of increasing the threshold voltage from Vth to Vth_m can be obtained. This second threshold voltage Vth_m is at a level much higher than 1.2 V, which is the actual operating voltage of a typical configuration bit circuit, and accordingly, it is possible to prevent unwanted phase change of the phase change memory during operation.

In this way, the threshold voltage can be increased in the phase change memory having a predetermined composition and structure through the voltage applied in both directions. To this end, the configuration bit circuit for the programmable logic device according to the present invention may include a first phase change memory element and a second phase change memory element connected in series with each other between the first power source and the second power source, and a transmission gate connected to the first phase change memory element and second phase change memory element in a first direction.

In the conventional 1T-2P structure, since the current flows through a transistor during programming, the voltage cannot flow in both directions, and accordingly, the phase change memory cannot be programmed through bidirectional voltage. In contrast, in the present invention, it is possible to apply a voltage to the phase change memory in both directions by applying the transmission gate instead of the transistor.

Figure 7:
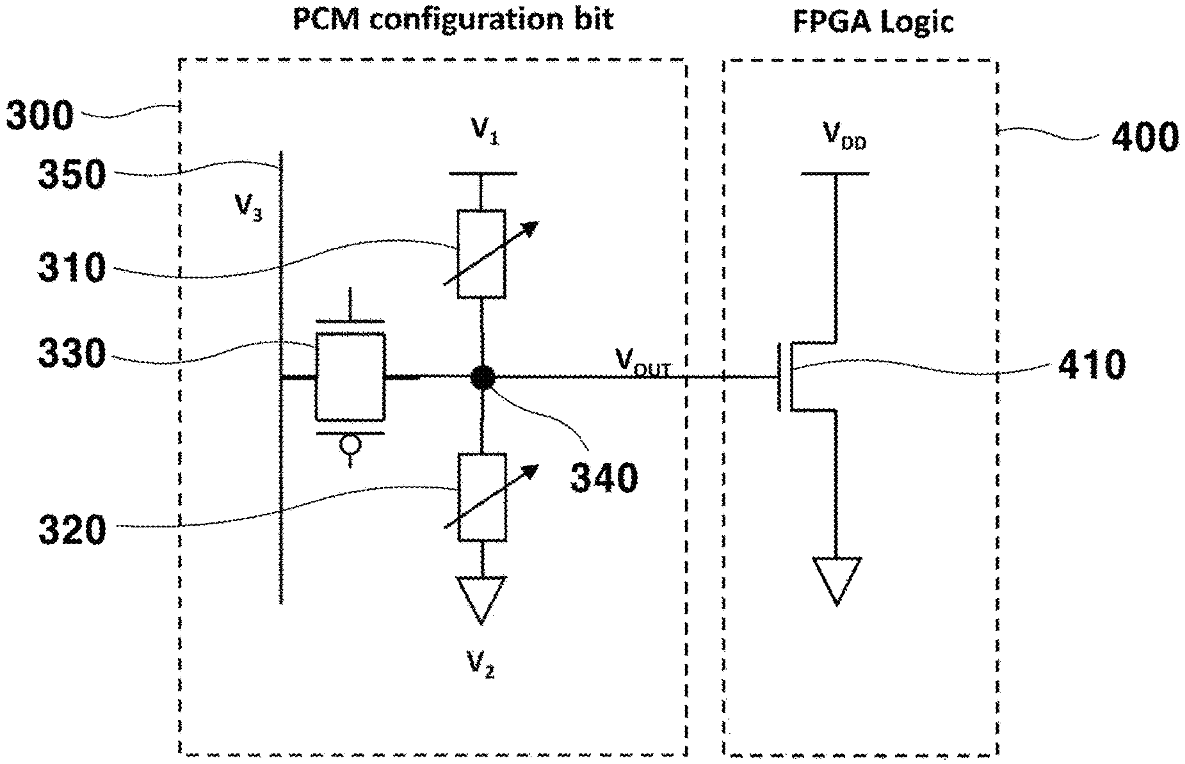
FIG. 7 is a diagram illustrating a configuration bit circuit according to an embodiment of the present invention.

One embodiment of the configuration bit circuit according to the present invention is illustrated in FIG. 7. A first phase change memory 310 and a second phase change memory 320 are connected in series between a first power source V1 and a second power source V2. A transmission gate 330 is connected in one direction from a node 340 located between the first phase change memory 310 and the second phase change memory 320, and an output terminal VOUT is connected to an FPGA logic circuit 400 in the other direction from the node 340. In this embodiment, the current flowing through the FPGA logic circuit 400 can be controlled by being connected to a gate electrode of a transistor 410 of the FPGA logic circuit 400.

Here, the first phase change memory and second phase change memory need to have high threshold voltages for a stable operation. To this end, materials forming a phase change layer of the first and second phase change memories may include Ge, Sb, and Te. This composition is generally referred to as GST and is known as a phase change memory composition having a high threshold voltage.

In particular, among the GST compositions, it is preferable that an atomic ratio is Ge<50 at %, Sb<40 at %, and Te≥50 at %. Through this combination of phase change layer, the threshold voltage of the phase change memory can be maximized, and in particular, it may be easy to induce the second high resistance state S-RESET by Te distribution through a Te content of more than half at an atomic ratio.

In the configuration bit circuit according to the present invention, it is possible to prevent unwanted phase change of the phase change memory even during operation through the phase change memory and circuit that can induce such a high high resistance state (high threshold voltage).

Meanwhile, the method of programming the configuration bit circuit according to the present invention that allows the phase change memory to have the high resistance state may be a programming method in which, when a voltage applied to a transmission gate from either a first power source or a second power source through either a first phase change memory or a second phase change memory is referred to as a first polarity voltage and a voltage applied from the transmission gate through one of the first phase change memory and the second phase change memory to one of the first power source and the second power source is referred to as a second polarity voltage, one of the first phase change memory and the second phase change memory becomes a first resistance state by the first polarity voltage and one of the first phase change memory and the second phase change memory becomes a second resistance state by the second polarity voltage, one of the first phase change memory and the second phase change memory is in the first resistance state and the other is in the second resistance state, one of the first resistance state and the second resistance state may refer to a low resistance state because the phase change memory is in a crystalline phase, and the other may refer to a high resistance state because the phase change memory is in an amorphous phase.

One embodiment of the method of programming the configuration bit circuit according to the present invention will be described in more detail with reference to FIGS. 8 and 9.

Figure 8:
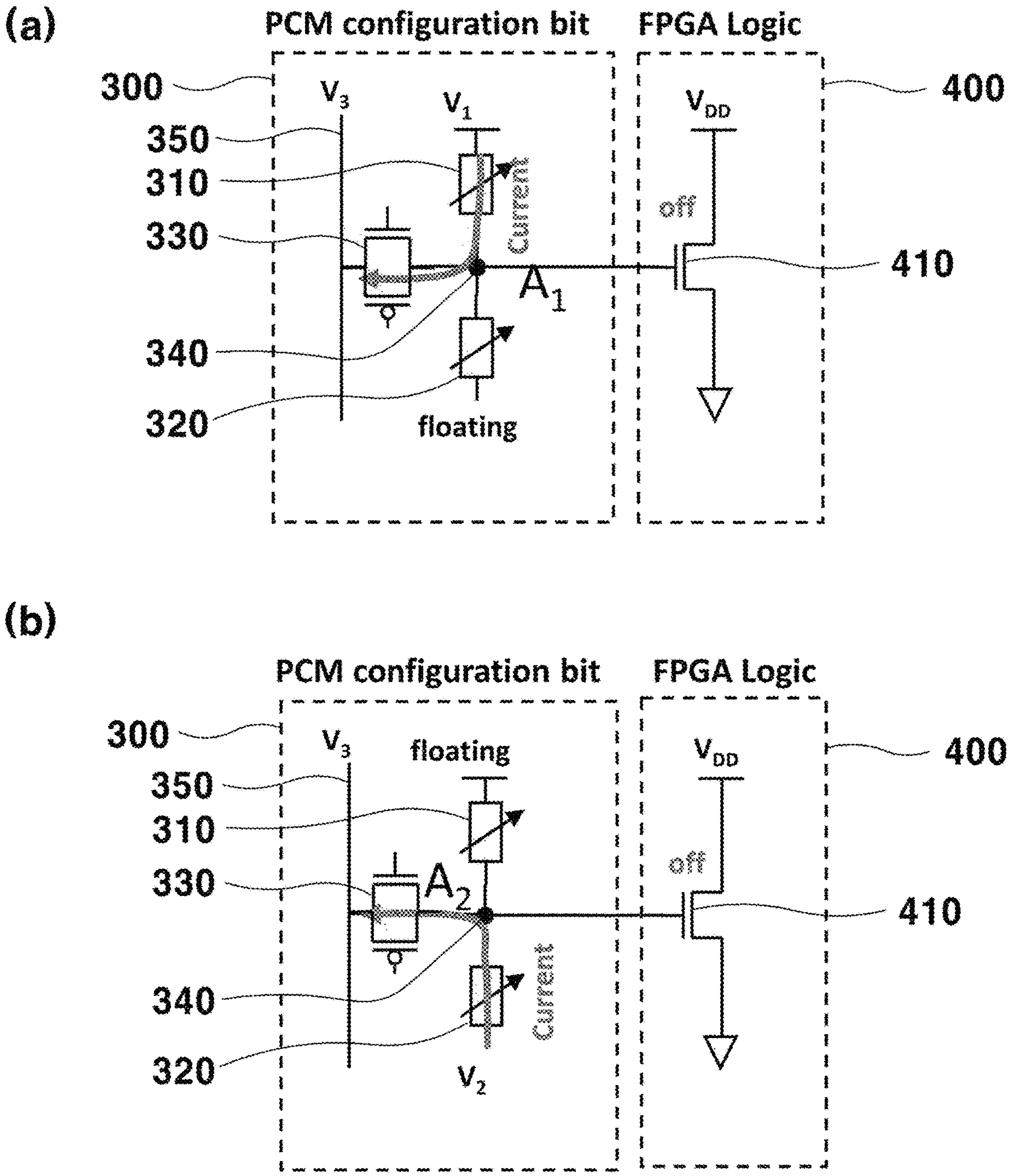
FIG. 8 is a diagram illustrating a method of programming the configuration bit circuit according to an embodiment of the present invention.

FIG. 8 illustrates that, when a voltage applied from the first power source V1 disposed adjacent to the first phase change memory 310 or the second power source V2 disposed adjacent to the second phase change memory 320 in the directions A1 and A2 of the transmission gate 330 is referred to as a first polarity voltage, a first phase change memory 321 or a second phase change memory 322 is programmed through the first polarity voltage.

The first polarity voltage is a voltage of the same polarity as when the actual configuration bit circuit operates for the phase change memory, and through the first polarity voltage, the first phase change memory 310 or the second phase change memory 320 may be programmed to be in the low resistance state SET. In this case, when a voltage is applied to the first phase change memory 310, the second phase change memory 320 becomes to be in a floating state, and conversely, when a voltage is applied to the second phase change memory 320, the first phase change memory 310 becomes to be in the floating state.

Figure 9:
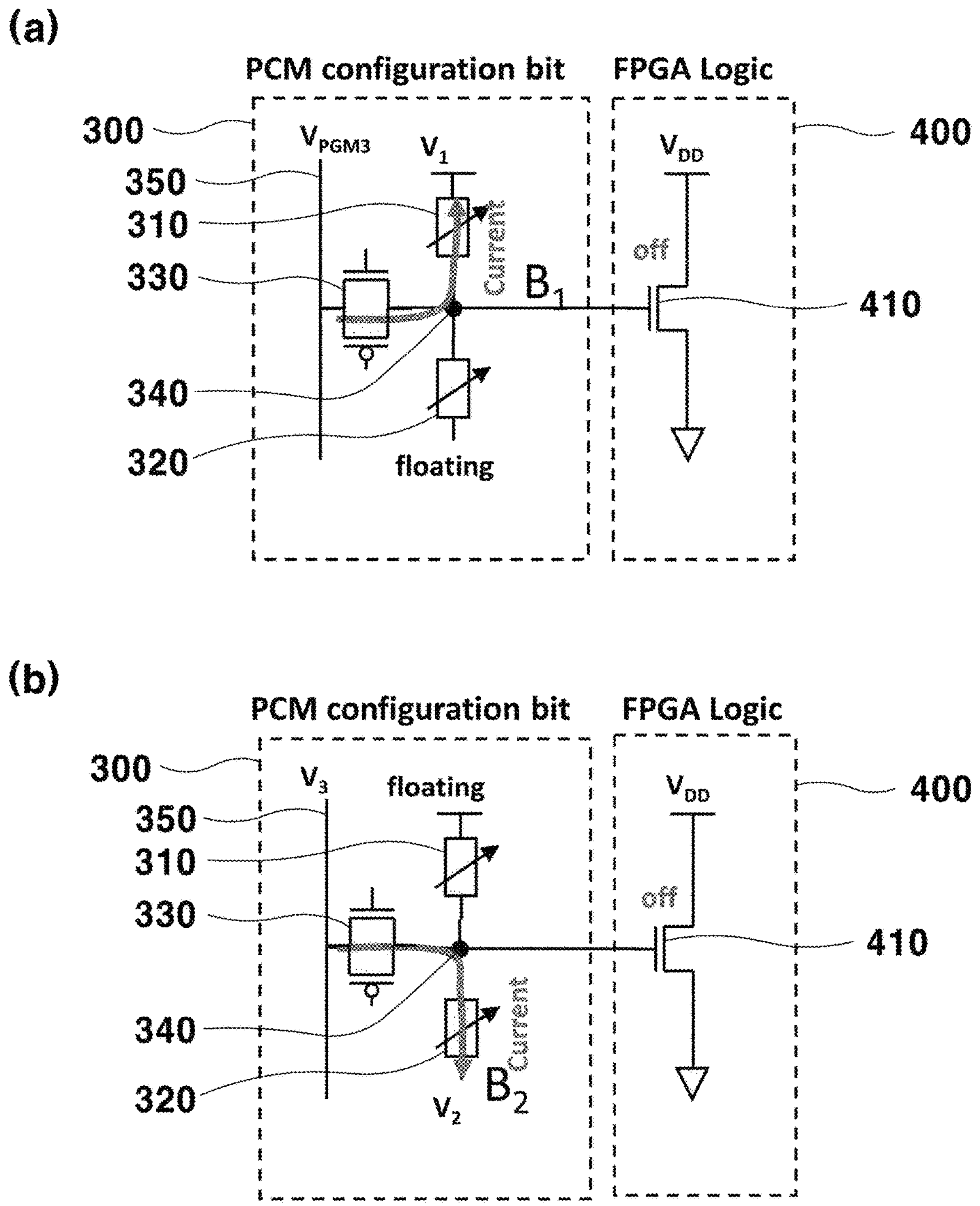
FIG. 9 is a diagram illustrating a method of programming a configuration bit circuit according to an embodiment of the present invention.

Meanwhile, FIG. 9 illustrates that the first phase change memory 310 or the second phase change memory 320 is programmed through the second polarity voltage. The second polarity voltage refers to a voltage applied from the transmission gate in the direction B1 or B2 of the first power source or second power source, as opposed to the first polarity voltage. When a magnitude of the second polar voltage becomes equal to or greater than a predetermined magnitude, the phase change memory has the high resistance state S-RESET among the amorphous states. As in FIG. 8, when a voltage is applied to one of the phase change memories, the other maintains the floating so as to prevent the phase change from occurring at the same time. In the phase change memory having such a high resistance state S-RESET, the threshold voltage thereof becomes higher ($V_{th\_m}$ in FIG. 5).

In this way, the resistance state of the first phase change memory 310 and second phase change memory 320 may be programmed by changing the resistance state to the low resistance state SET or the high resistance state S-RESET through the voltage applied in both directions, and accordingly, the threshold voltage can be maintained high. Phase change memories are programmed so that when one of them is in the low resistance state SET, the other is in the high resistance state S-RESET.

Figure 10:
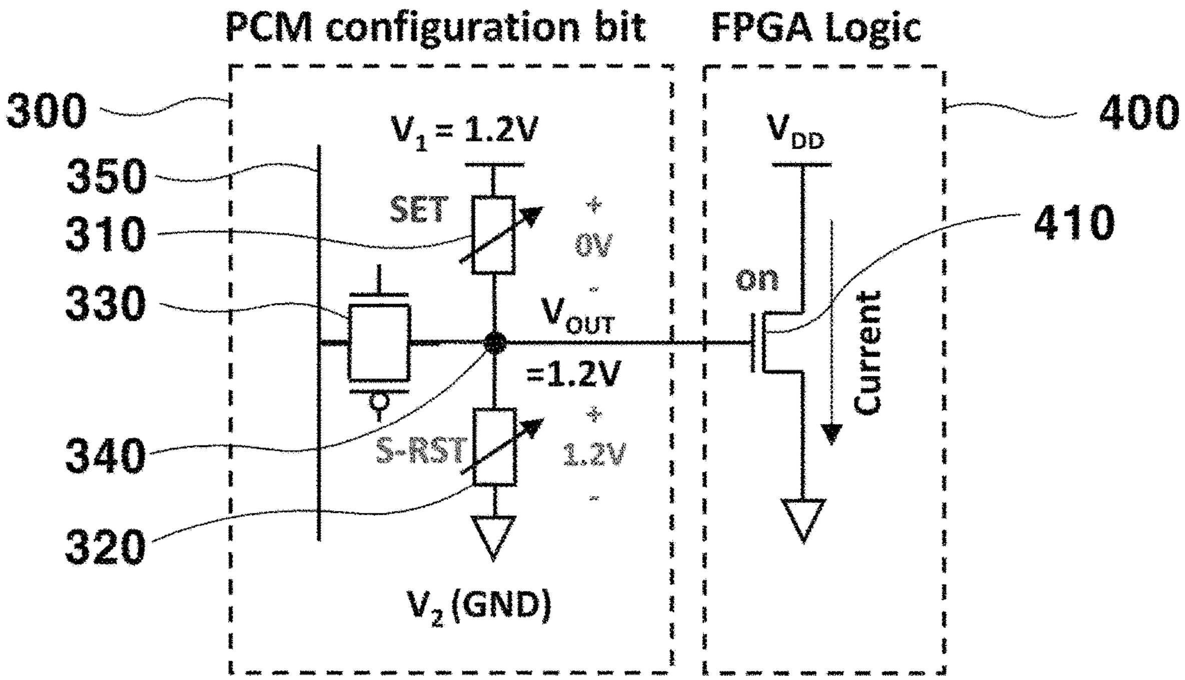
FIG. 10 is a diagram illustrating a method of operating a configuration bit circuit according to an embodiment of the present invention.
Figure 11:
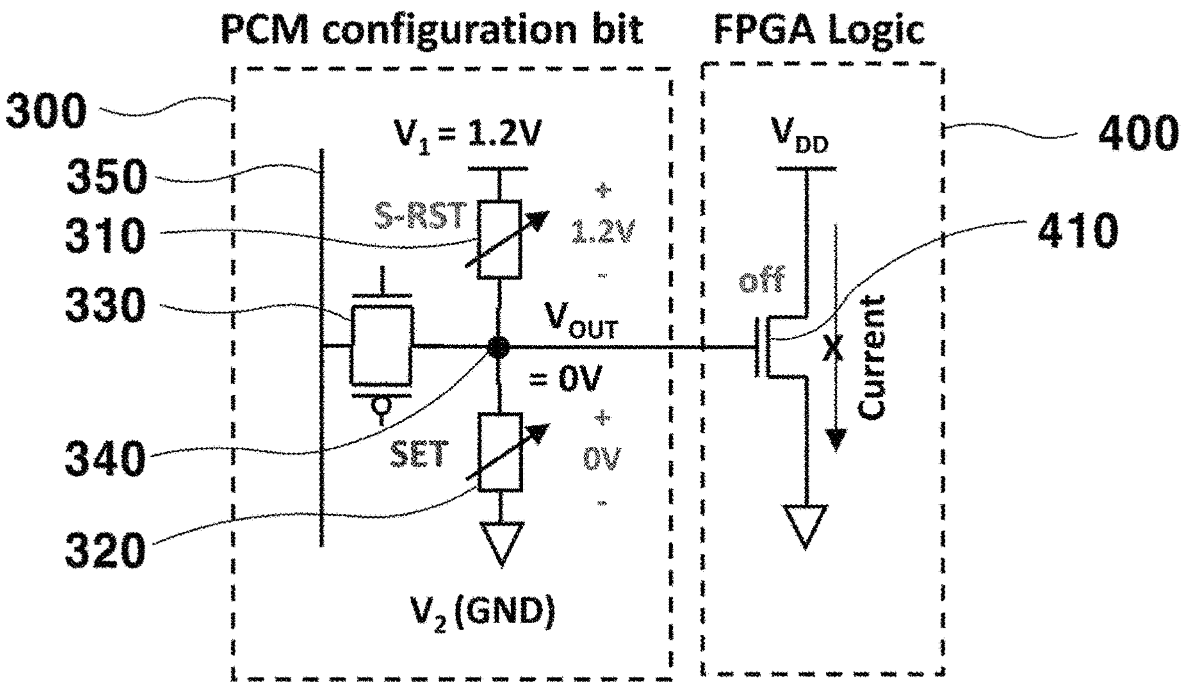
FIG. 11 is a diagram illustrating a method of operating a configuration bit circuit according to an embodiment of the present invention.

FIGS. 10 and 11 illustrate one embodiment when operating the configuration bit circuit programmed according to the present invention.

FIG. 10 illustrates the operation of the configuration bit circuit in which the first phase change memory 310 is in the low resistance state SET and the second phase change memory 320 is in a high resistance state S-RST. As illustrated in FIG. 9(*b*), according to the method of programming the component bit circuit according to the present invention, the second phase change memory 320 is programmed to the high high resistance state S-SRT and can thus have a high threshold voltage (e.g., 2.0 V). The transmission gate 330 is maintained in an off state, and when a voltage is applied from the first power source V1, it is output to an output terminal through the first phase change memory 310 in the low resistance state and applied to the FPGA logic circuit. In this embodiment, the voltage applied from the first power source V1 is 1.2 V, which is less than the threshold voltage of the second phase change memory 320. Therefore, even if a voltage is applied to the second phase change memory 320 from the first power source V1, only a very low current flows, and thus there is no possibility of the phase change occurring. A current of 1.2 V flows from the first power source V1 to the output terminal through the first phase change memory 310 to control the transistor disposed in the FPGA logic circuit, thereby controlling the current flow in the circuit.

FIG. 11 illustrates the operation of the configuration bit circuit in which the first phase change memory is in the high resistance state S-RST and the second phase change memory is in the low resistance state RESET. The threshold voltage of the first phase change memory 310 was set to 2.0 V by the programming method illustrated in FIG. 9(*a*). Thereafter, when the voltage of 1.2 V is applied from the first power source V1 in order to operate the configuration bit circuit, a voltage lower than the threshold voltage of the first phase change memory 310 is applied and thus does not pass through the first phase change memory 320. Accordingly, 0 V is output from the second power source V2, which is the ground power source, to the output terminal, and as a result, the current of the FPGA logic circuit is controlled.

The programmable logic device including the configuration bit circuit capable of being provided according to the present invention can reduce time when starting up, have a small area, have excellent security, and are resistant to radiation compared to the conventional programmable logic elements that include the SRAM-based configuration bit circuit.

What is claimed is:

1. A configuration bit circuit for a programmable logic device including a phase change memory, the configuration bit circuit comprising:

a first phase change memory and a second phase change memory connected in series with each other between a first power source and a second power source, wherein the first power source and the second power source are different power sources; and a transmission gate comprising an NMOS transistor and a PMOS transistor connected in parallel, and the transmission gate connected to a node between the first phase change memory and the second phase change memory in a first direction, wherein an output terminal from the node is connected to a gate electrode of a transistor of a logic circuit of the programmable logic device to control a current flowing through the logic circuit, wherein the transmission gate enables a bidirectional voltage application to program the first phase change memory and the second phase change memory into complementary states such that one of the first phase change memory and the second phase change memory is in a low resistance state of a crystalline phase and a remaining one of the first phase change memory and the second phase change memory is in a high resistance state of an amorphous phase, the high resistance state having a threshold voltage higher than an operating voltage of the configuration bit circuit.

2. The configuration bit circuit according to claim 1, wherein a composition of a phase change layer in the first phase change memory and the second phase change memory includes Ge, Sb, and Te.

3. The configuration bit circuit according to claim 2, wherein the composition of the phase change layer is Ge<50 at %, Sb<40 at %, and Te ≥50 at % at an atomic ratio.

4. A method of programming the configuration bit circuit for the programmable logic device including the phase change memory according to claim 1, the method comprising:

when a voltage applied to the transmission gate from the first power source or the second power source through the first phase change memory or the second phase change memory is referred to as a first polarity voltage and a voltage applied from the transmission gate through the first phase change memory or the second phase change memory to the first power source or the second power source is referred to as a second polarity voltage, programming the first phase change memory or the second phase change memory to be in a first resistance state by the first polarity voltage; and programming the first phase change memory or the second phase change memory to be in a second resistance state by the second polarity voltage, wherein one of the first phase change memory and the second phase change memory is in the first resistance state and a remaining one of the first phase change memory and the second phase change memory is in the second resistance state, and one of the first resistance state and the second resistance state refers to a low resistance state because the phase change memory is in a crystalline phase, and a remaining one of the first resistance state and the second resistance state refers to a high resistance state because the phase change memory is in an amorphous phase.

5. A method of operating the configuration bit circuit for the programmable logic device including the phase change memory according to claim 1, wherein a voltage applied to the first power source or the second power source for an operation of the configuration bit circuit is lower than a threshold voltage when the first phase change memory or the second phase change memory is in a high resistance state.

6. A programmable logic element including the configuration bit circuit according to claim 1.

* * * * *